(12) United States Patent
Tolmachev et al.

(10) Patent No.: US 7,210,424 B2
(45) Date of Patent: May 1, 2007

(54) HIGH-DENSITY PLASMA PROCESSING APPARATUS

(75) Inventors: Yuri Nikolaevich Tolmachev, Suwon-si (KR); Sergiy Yakovlevich Navala, Suwon-si (KR); Dong-joon Ma, Anyang-si (KR); Dae-il Kim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 119 days.

(21) Appl. No.: 10/843,430

(22) Filed: May 12, 2004

(65) Prior Publication Data

US 2004/0261720 A1 Dec. 30, 2004

(30) Foreign Application Priority Data

Jun. 24, 2003 (KR) .................. 10-2003-0041225

(51) Int. Cl.
*C23C 16/00* (2006.01)
*C23F 1/00* (2006.01)
*H01L 21/306* (2006.01)

(52) U.S. Cl. .................. 118/723 MW; 156/345.36; 156/345.41; 156/345.42; 156/345.46; 156/345.48; 156/345.49; 118/723 I

(58) Field of Classification Search ....... 118/723 MW; 156/345.36, 345.41
See application file for complete search history.

(56) References Cited

U.S. PATENT DOCUMENTS 4,778,561 A * 10/1988 Ghanbari .................. 216/70
4,952,273 A * 8/1990 Popov .................. 216/70
5,081,398 A * 1/1992 Asmussen et al. ...... 315/111.41
5,134,965 A * 8/1992 Tokuda et al. ...... 118/723 MW
5,279,669 A * 1/1994 Lee .................. 118/723 MR
5,837,093 A * 11/1998 Hasegawa et al. ..... 156/345.33
6,028,285 A * 2/2000 Khater et al. .......... 219/121.43
6,322,661 B1 * 11/2001 Bailey et al. .......... 156/345.49
6,847,003 B2 * 1/2005 Ishii et al. ............. 219/121.43
2002/0121344 A1 9/2002 Noguchi et al. ....... 156/345.48

FOREIGN PATENT DOCUMENTS

JP 06231899 A * 8/1994

* cited by examiner

*Primary Examiner*—Parviz Hassanzadeh
*Assistant Examiner*—Rakesh K. Dhingra
(74) *Attorney, Agent, or Firm*—Lee & Morse, P.C.

(57) ABSTRACT

A high-density plasma processing apparatus includes a processing chamber, having a susceptor for supporting an object to be processed positioned therein and a dielectric window positioned on the processing chamber to form an upper surface of the processing chamber. A reaction gas injection device injects a reaction gas into an interior of the processing chamber. An inductively coupled plasma (ICP) antenna, which is installed on a center of the dielectric window, transfers radio frequency (RF) power from an RF power supply to the interior of the processing chamber. A waveguide guides a microwave generated by a microwave generator. A circular radiative tube, which is installed on the dielectric window around the ICP antenna and is connected to the waveguide, radiates a microwave toward the interior of the processing chamber via a plurality of slots formed through a bottom wall of the radiative tube.

17 Claims, 5 Drawing Sheets

HIGH-DENSITY PLASMA PROCESSING APPARATUS

BACKGROUND OF THE INVENTION

1. Field of the Invention

The present invention relates to a high-density plasma processing apparatus. More particularly, the present invention relates to a high-density plasma processing apparatus that is designed to improve uniformity of a distribution of plasma near a surface of a substrate.

2. Description of the Related Art

Plasma application techniques are widely used in a process of microfabricating a substrate used to manufacture a semiconductor device or a flat display panel. In particular, plasma is widely used to etch the surface of a wafer used to manufacture a semiconductor device or the surface of a substrate used to manufacture a liquid crystal display (LCD). In addition, plasma is widely used to deposit a predetermined material layer on the surface of the substrate or wafer. Accordingly, development of a plasma processing apparatus suitable for a wafer etching process or a process of depositing a layer on a wafer is critical to the development of methods and apparatuses for manufacturing a semiconductor device or a flat display panel.

There are a variety of types of conventional plasma processing apparatuses that are presently in widespread use, including an inductively coupled plasma (ICP) processing apparatus and a plasma processing apparatus using microwaves.

FIG. 1 illustrates a schematic structure of a conventional ICP processing apparatus. Referring to FIG. 1, the conventional ICP processing apparatus includes a processing chamber 10 defining a plasma forming space. A susceptor 12 is installed at an inner bottom surface of the processing chamber 10 to support an object to be processed, e.g., a wafer (W). A dielectric window 16 is installed on top of the processing chamber 10 to form a top surface of the processing chamber 10. A gas inlet 14 for introducing a reaction gas into the processing chamber 10 is formed through one sidewall of the processing chamber 10. A plurality of gas distribution ports 15, which is connected to the gas inlet 14, is formed within the processing chamber 10. A vacuum suction port 18, which is connected to a vacuum pump 19, is formed through a bottom wall of the processing chamber 10. The vacuum pump 19 evacuates air from the processing chamber 10 through the vacuum suction port 18 to create vacuum conditions within the processing chamber 10, thereby sealing the processing chamber 10. An ICP antenna 20 for generating plasma within the processing chamber 10 is installed over the dielectric window 16.

An RF power supply (not shown) is connected to the ICP antenna 20. Accordingly, an RF current flows through the ICP antenna 20 and generates a magnetic field. Due to a change in the magnetic field with time, an electric field is induced within the processing chamber 10. At this time in an operation of the apparatus, the reaction gas is introduced into the processing chamber 10 via the gas distribution ports 15. Electrons accelerated by the induced electric field then ionize the reaction gas by colliding with the reaction gas, thereby generating a plasma within the processing chamber 10. The generated plasma is used to etch a surface of the wafer W while chemically reacting with the surface of the wafer W or to deposit a predetermined material layer on the surface of the wafer W.

FIG. 2 illustrates a conventional plasma processing apparatus using microwaves. The plasma processing apparatus of FIG. 2 includes a plasma source 40 and a processing chamber 30. The plasma source 40 includes a microwave generator (not shown), a waveguide 41, and a radiative tube 42. The waveguide 41 transfers a microwave oscillated by the microwave generator and has a rectangular cross-section. The radiative tube 42 has a plurality of slots 43 for radiating the microwave into the processing chamber 30. The slots 43 may be formed in various shapes.

The processing chamber 30 includes a dielectric window 31, a support 32, and gas inlets 33. The dielectric window 31 is installed on top of the processing chamber 30, and the radiative tube 42 is installed on the dielectric window 31. The support 32 for supporting an object to be processed, e.g., a wafer, is installed within the processing chamber 30 opposite to the dielectric window 31. The support 32 is connected to a power supply 35. An exhaust port 34 is formed through a bottom wall of the processing chamber 30 and used to create vacuum conditions within the processing chamber 30.

In conventional plasma processing apparatuses having structures such as those described above, the distribution of plasma near a wafer is not uniform.

FIGS. 3A and 3B are graphs showing a relationship between a distribution of plasma through a plasma generating area within a processing chamber and a distribution of plasma near a wafer. As shown in FIG. 3A, even when plasma is uniformly distributed through the plasma generating area, a distribution of plasma near the wafer is non-uniform due to diffusion. Hence, to obtain uniform distribution of plasma near the wafer, it is desirable to form a plasma distribution having a plasma density greater near a peripheral area of an interior of the processing chamber than near a central area, i.e., an "M-shaped" plasma distribution, through the plasma generating area, as shown in FIG. 3B.

When the distribution of plasma is non-uniform as described above, an etching depth of the wafer W or a thickness and property of a material layer deposited on the surface of the wafer W varies over the surface of the wafer W.

In particular, this variation becomes severe as a size of a substrate increases. In the case of ICP processing apparatuses, as the substrate becomes larger, a size of an ICP antenna used must be larger in order to maintain a high plasma density within a processing chamber. However, since a voltage applied to the ICP antenna necessarily increases with the enlargement of the ICP antenna, there is a limit in enlarging the ICP antenna. In addition, in the case of plasma processing apparatuses using microwaves, transmitting the high power of the microwave to the interior of a processing chamber without a substantial increase in the size of a microwave source is difficult, and uniformly distributing the power of a microwave into the processing chamber is also difficult.

As described above, the conventional plasma processing apparatuses are not able to satisfactorily cope with a change in process conditions because of the aforementioned problems and accordingly can provide neither a high plasma density nor a uniform distribution of plasma. In particular, with a recent trend toward the enlargement of a wafer, it becomes more difficult for the conventional plasma processing apparatuses to maintain the uniformity of the distribution of plasma near a wafer. This non-uniformity significantly degrades the quality or yield of semiconductor devices. Therefore, both an improvement in the uniformity of a wafer processing process with an enlarged wafer and maintenance of a high plasma density are primary considerations in the development of a plasma processing apparatus.

SUMMARY OF THE INVENTION

The present invention is therefore directed to a high-density plasma processing apparatus providing uniformity of a distribution of plasma near a surface of a substrate, which substantially overcomes one or more of the problems due to the limitations and disadvantages of the related art.

It is therefore a feature of an embodiment of the present invention to provide a high-density plasma processing apparatus that is able to improve the uniformity of the distribution of plasma near the surface of a large wafer by including both an inductively coupled plasma source and a microwave source that are independently controlled.

At least the above and other features and advantages of the present invention may be realized by providing a high-density plasma processing apparatus including a processing chamber, including a susceptor for supporting an object to be processed positioned therein, and a dielectric window positioned on the processing chamber to form an upper surface of the processing chamber, a reaction gas injection device for injecting a reaction gas into an interior of the processing chamber, an inductively coupled plasma (ICP) antenna, which is installed on a center of the dielectric window, for transferring radio frequency (RF) power from an RF power supply to the interior of the processing chamber, a waveguide for guiding a microwave generated by a microwave generator, and a circular radiative tube, which is installed on the dielectric window around the ICP antenna and is connected to the waveguide, for radiating a microwave toward the interior of the processing chamber via a plurality of slots formed through a bottom wall of the circular radiative tube.

In the apparatus, the RF power may be transferred to a central area of the interior of the processing chamber by the ICP antenna and the microwave power may be supplied to a peripheral area of the interior of the processing chamber through the plurality of slots in the circular radiative tube. Further, the RF power and the microwave power may be independently controlled.

The apparatus may further include a plurality of magnets installed around an outer circumference of the processing chamber for forming a magnetic field within the processing chamber so that a microwave supplied to a peripheral area of the processing chamber in cooperation with plasma can cause electron cyclotron resonance (ECR).

The apparatus may further include an ICP zone, wherein ICP has been distributed with a high density, formed in the central area of the interior of the processing chamber and an ECR zone, wherein ECR occurs, formed in the peripheral area of the interior of the processing chamber.

In the apparatus, each of the plurality of magnets installed around the outer circumference of the processing chamber may be arranged at a predetermined interval. Further, each of the plurality of magnets may be operable to move up and down. Each of the plurality of magnets may be an electromagnet or a permanent magnet.

In the apparatus, the susceptor may be operable to move up and down. Further, the susceptor may be an electrostatic chuck and may secure the object to be processed using an electrostatic force.

In an embodiment of the apparatus, the reaction gas injection device may include a circular injector having a plurality of gas distribution ports, the circular injector being installed on an inner surface of a sidewall of the processing chamber. In another embodiment of the apparatus, the reaction gas injection device may include a showerhead having a plurality of gas distributions ports, the showerhead being installed through the center of the dielectric window. In still another embodiment of the apparatus, the reaction gas injection device may include a circular injector having a plurality of gas distribution ports, the circular injector being installed on an inner surface of a sidewall of the processing chamber and a showerhead having a plurality of gas distributions ports, the showerhead being installed through the center of the dielectric window.

The apparatus may further include a circulator and a tuner installed on the waveguide.

In the apparatus, the circular radiative tube may have a rectangular cross-section. Further, the waveguide may have a rectangular cross-section.

In the apparatus, the plurality of slots may be arranged along a circumference of the circular radiative tube.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
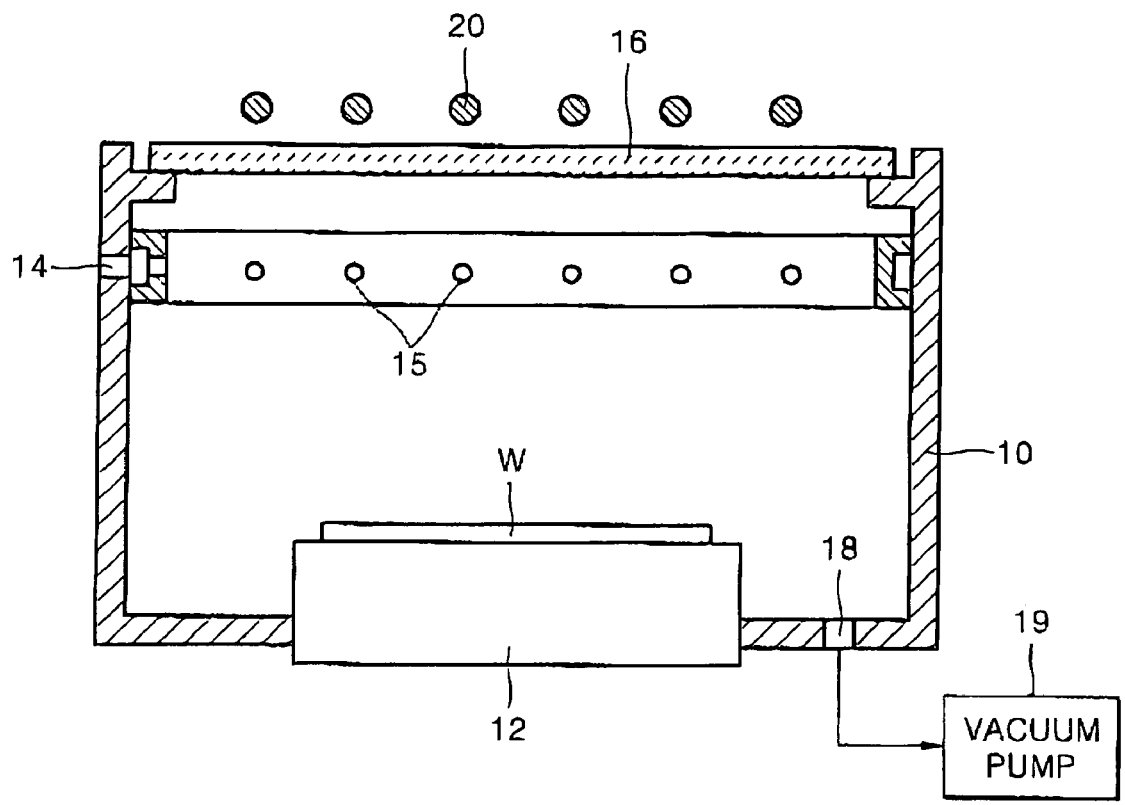
FIG. 1 illustrates a schematic structure of a conventional inductively coupled plasma (ICP) processing apparatus.
Figure 2:
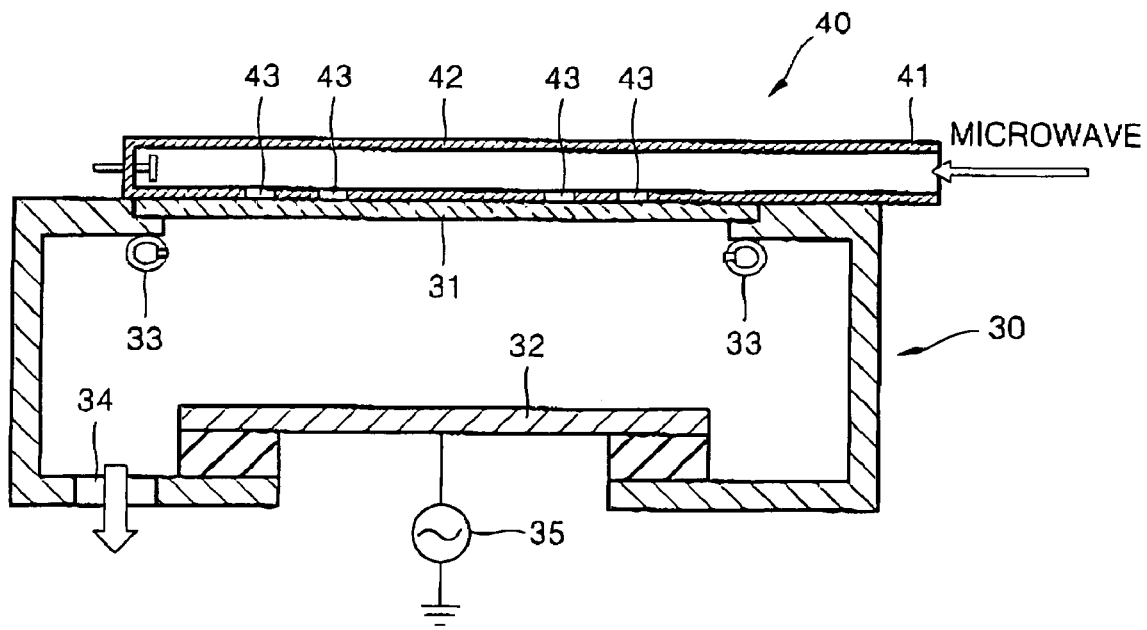
FIG. 2 illustrates a schematic structure of a conventional plasma processing apparatus using microwaves.

Korean Patent Application No. 2003-41225, filed on Jun. 24, 2003, in the Korean Intellectual Property Office, and entitled: "High-Density Plasma Processing Apparatus," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

Figure 4:
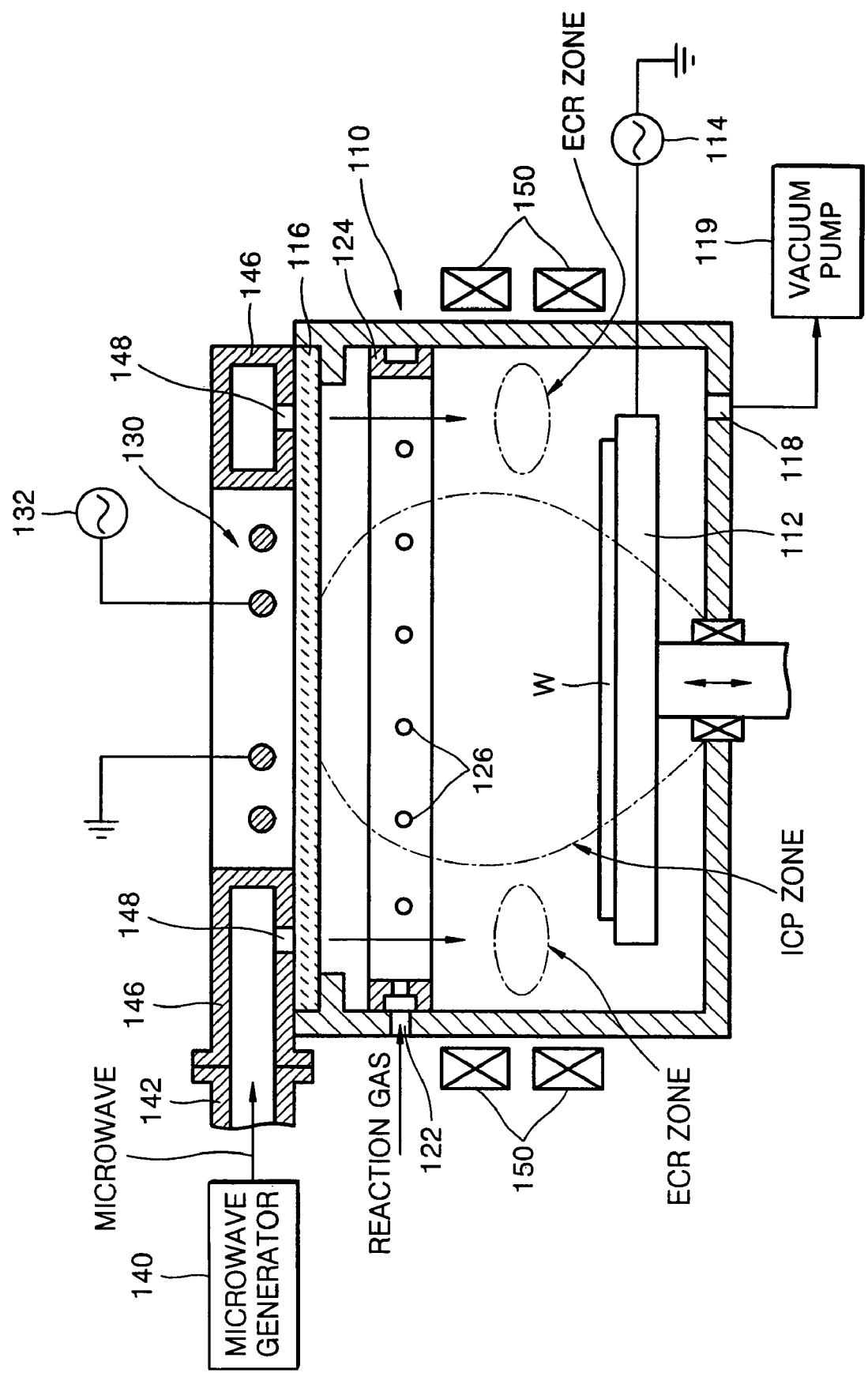
FIG. 4 illustrates a vertical cross-section of a structure of a high-density plasma processing apparatus according to a first embodiment of the present invention.
Figure 5:
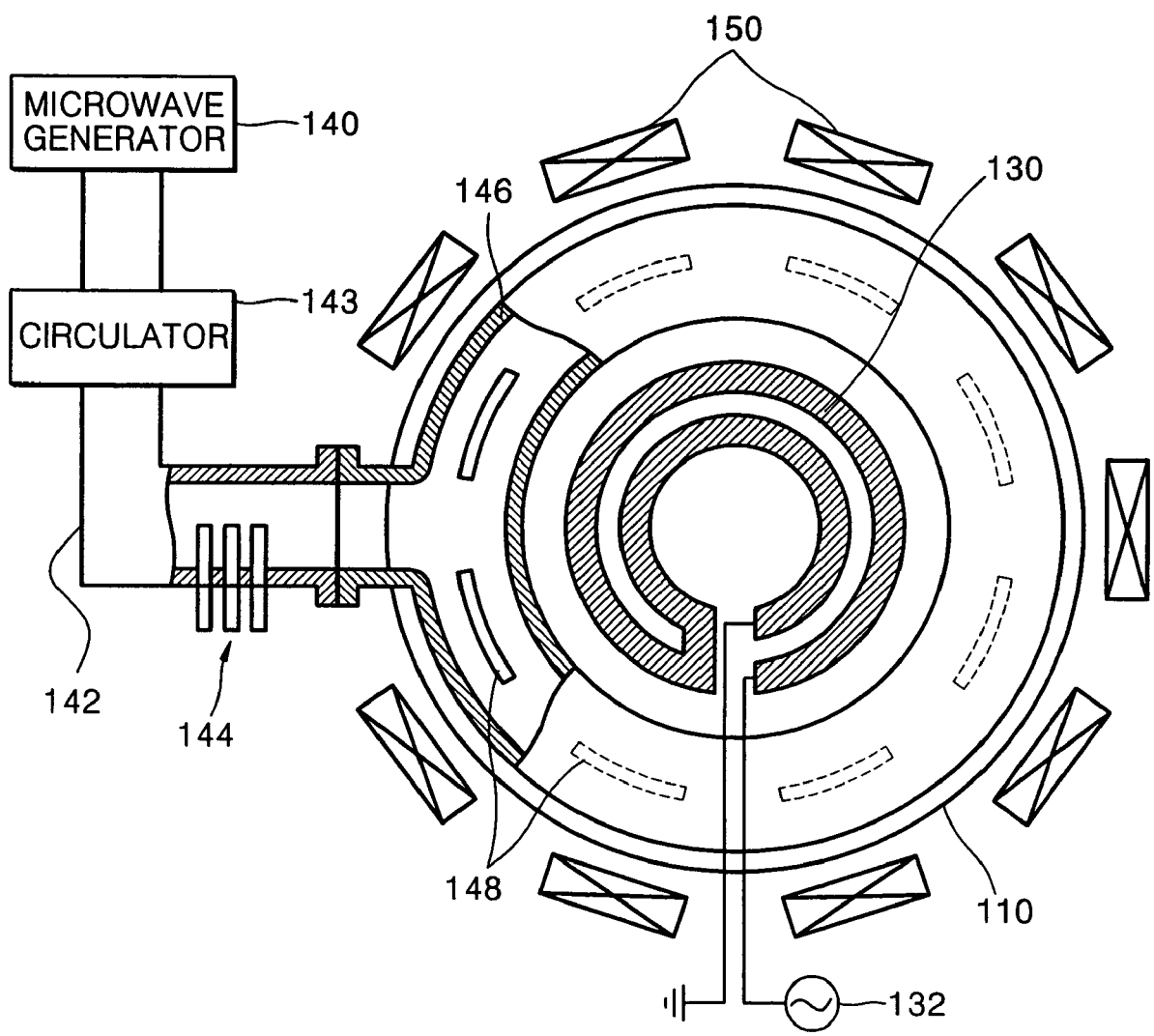
FIG. 5 illustrates a plan view of the high-density plasma processing apparatus of FIG. 4.

FIGS. 4 and 5 illustrate a vertical cross-section and a plan view, respectively, of a structure of a high-density plasma processing apparatus according to a first embodiment of the present invention. Referring to FIGS. 4 and 5, the high-density plasma processing apparatus of the present invention is a semiconductor manufacturing apparatus for performing a wafer microprocessing, e.g., a process of etching a surface of a silicon wafer (W) for use in a semiconductor device using plasma or a process of depositing a material layer on a surface of the silicon wafer W using plasma.

The high-density plasma processing apparatus includes a processing chamber 110 defining a plasma forming space. An interior of the processing chamber 110 is maintained under vacuum conditions. To achieve vacuum conditions, a vacuum suction port 118, which is coupled to a vacuum pump 119, is formed through a bottom wall of the processing chamber 110.

A susceptor 112 for supporting an object to be processed, e.g., a wafer W, is installed in the processing chamber 110. An electrostatic chuck, to which the wafer W is secured using an electrostatic force, may be used as the susceptor 112. The susceptor 112 is connected to a power supply 114 that provides a bias voltage to the susceptor 112 so that ions emitted from plasma generated within the processing chamber 10 can collide with the surface of the wafer W with sufficiently high energy. The susceptor 112 may be operable to move up and down, as shown by an arrow in FIG. 4. Accordingly, the plasma density and the uniformity of a plasma distribution can be easily controlled while adaptively coping with a wide range of process parameters. More specifically, by moving the susceptor 112 up or down, the wafer W supported thereby can be positioned at a location where uniform plasma distribution can be achieved.

A window 116, which is made of a dielectric so as to transmit radio frequency (RF) power and microwave power, is installed on top of the processing chamber 110 to form an upper surface of the processing chamber 110. The dielectric window 116 separates the interior of the processing chamber 110 from the outside environment.

A gas inlet 122 for injecting a reaction gas into the processing chamber 110 is formed through a sidewall of the processing chamber 110. A circular injector 124 having a plurality of gas distribution ports 126 is installed on an inner surface of the sidewall of the processing chamber 110. The reaction gas, which is introduced into the processing chamber 110 through the gas inlet 122, is distributed throughout the interior of the processing chamber 110 through the plurality of gas distribution ports 126.

An inductively coupled plasma (ICP) antenna 130 is installed on top of the processing chamber 110. More specifically, the ICP antenna 130 is installed on an upper surface of the dielectric window 116 and transfers RF power to the interior of the processing chamber 110 to ionize the reaction gas within the processing chamber 110 to generate plasma. An RF power supply 132 is connected to the ICP antenna 130. The ICP antenna 130 is positioned opposite to a central area of the interior of the processing chamber 110.

As shown in FIG. 5, the ICP antenna 130 is a coil having a plurality of concentric circles. Alternatively, the ICP antenna 130 may be a spiral coil or any coil wound in well-known shapes. In other words, the ICP antenna 130 may have various shapes.

The plasma processing apparatus according to the first embodiment of the present invention includes a microwave source for producing plasma using a microwave. The microwave source includes a microwave generator 140, a waveguide 142, and a circular radiative tube 146. The radiative tube 146 is referred to as being circular because it has a shape of a ring surrounding the ICP antenna 130. The radiative tube 146 is installed on the dielectric window 116 opposite to a peripheral area of the interior of the processing chamber 110. A plurality of slots 148 is formed through a bottom wall of the radiative tube 146. A microwave is introduced into the processing chamber 110 through the plurality of slots 148. The microwave is generated by the microwave generator 140 and transferred to the radiative tube 146 via the waveguide 142, which connects the microwave generator 140 and the radiative tube 146. As shown in FIG. 5, a circulator 143 and a tuner 144 may be additionally installed on the waveguide 142, which transfers a microwave. Preferably, the waveguide 142 has a rectangular cross-section. However, the waveguide 142 may have various alternate cross-sectional shapes.

The radiative tube 146 may also have various alternate cross-sectional shapes. However, the radiative tube 146 preferably has a rectangular cross-section, as shown in FIG. 5. As shown in FIG. 5, the plurality of slots 148 can be formed through the bottom wall of the radiative tube 146 along a circumference of the radiative tube 146. In addition, the plurality of slots 148 may have various alternate shapes suitable for radiating a microwave and may be arranged in various configurations.

As described above, the plasma processing apparatus according to the first embodiment of the present invention includes both the ICP antenna 130 and the microwave source. Since the ICP antenna 130 is located opposite to the central area of the interior of the processing chamber 110, inductively coupled plasma generated by RF power supplied from the ICP antenna 130 is distributed with a high density over the central area of the interior of the processing chamber 110. Due to the small size of the ICP antenna 130 and shielding caused by plasma, an RF electromagnetic field formed by the ICP antenna 130 becomes rapidly weaker near the sidewalls of the processing chamber 110. However, since the radiative tube 146 is located opposite to the peripheral area of the interior of the processing chamber 110, plasma generated by microwave power supplied via the plurality of slots 148 of the radiative tube 146 is distributed throughout the peripheral area of the interior of the processing chamber 110. Hence, the density of plasma generated in the peripheral area of the interior of the processing chamber 110 can be increased.

Since an RF is substantially different from a microwave frequency, two plasma sources can be independently controlled. More specifically, whereas a microwave frequency ranges approximately from 1 to 50 GHz and is typically 2.45 GHz, an RF is typically 13.56 MHz. Hence, an RF and a microwave frequency have different bands and accordingly do not interfere with or otherwise affect one another. Thus, the RF power transferred to the central area of the interior of the processing chamber 110 by the ICP antenna 130 can be controlled independently of the microwave power supplied to the peripheral area of the interior of the processing chamber 110 through the plurality of slots 148 in the radiative tube 146. Accordingly, it is possible to control the distribution of plasma generated within the processing chamber 110 with increased precision. This increased precision results in the uniformity of the distribution of plasma near the wafer W being improved.

The plasma processing apparatus according to the first embodiment of the present invention may include a plurality of magnets 150 in order to form a magnetic field within the processing chamber 110. Preferably, the plurality of magnets 150 is installed around an outer circumference of the processing chamber 110. A permanent magnet or an electromagnet may be used as each of the magnets 150. Each of the plurality of magnets 150 may be arranged around the outer circumference of the processing chamber 110 at a predetermined interval. By way of example, if the microwave generated by the microwave generator 140 has a frequency of 2.45 GHz, a magnetic field formed by the magnets 150 has an intensity of about 875 Gauss.

The plurality of magnets 150 form a magnetic field within the processing chamber 110 so that the microwave supplied to the peripheral area of the interior of the processing chamber 110 in cooperation with the plasma generated near the peripheral area thereof can cause electron cyclotron resonance (ECR). An ICP zone, where ICP has been distributed with a high density, is formed in the central area of the interior of the processing chamber 110, and an ECR zone is formed in the peripheral area thereof.

Figure 3A:
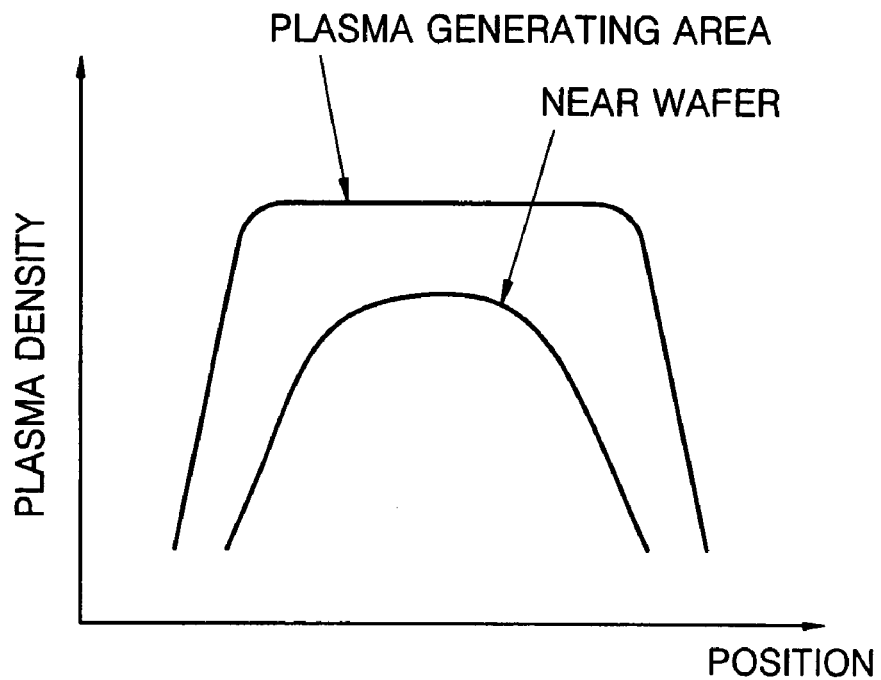
FIGS. 3A and 3B are graphs showing a relationship between a distribution of plasma through a plasma generating area within a processing chamber and a distribution of plasma near a wafer.
Figure 3B:
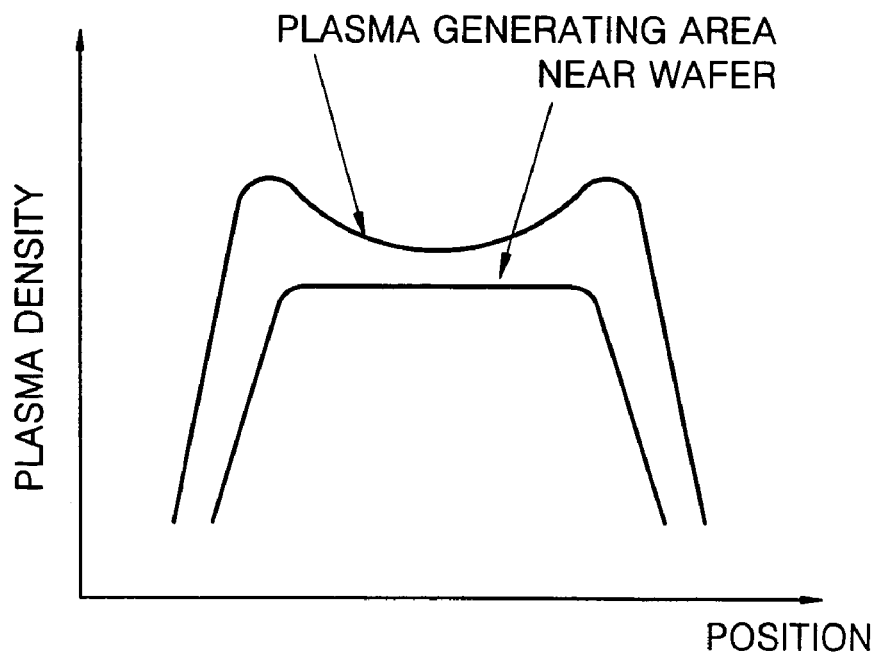

ECR denotes resonance that occurs when a frequency of cyclotron rotations of electrons within a magnetic field is the same as a frequency of microwaves applied to the electrons. As is well known, when such resonance occurs, the efficiency with which electrons absorb energy from applied microwaves is improved. It is also well known that, particularly as the pressure of the interior of the processing chamber 110 decreases, the energy absorbing efficiency of electrons increases. Hence, the efficiency with which microwave power is absorbed by plasma due to ECR can be improved even at a low pressure of about 10 to 20 mTorr. Therefore, the density of plasma generated in the peripheral area of the interior of the processing chamber 110 can be increased. Thus, the "M-shaped" plasma distribution, as shown in FIG. 3B, can be easily obtained.

Preferably, each of the plurality of magnets 150 is operable to move up and down. Because the location of the ECR zone moves depending on the vertical motion of the magnets 150, movement of the magnets 150 allows the density of plasma and the uniformity of the distribution of plasma to be more easily controlled while adaptively coping with a wide range of process parameters.

Figure 6:
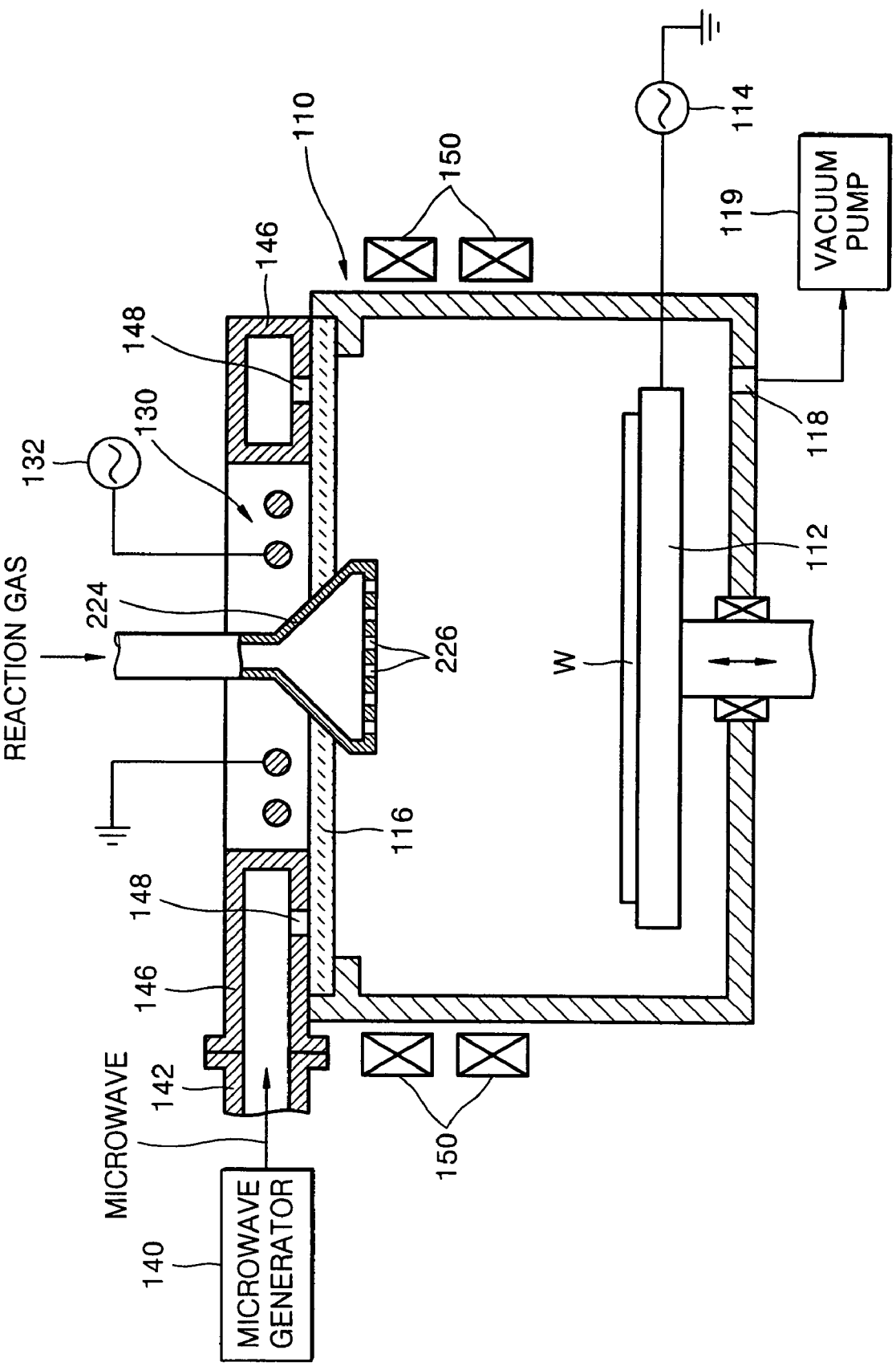
FIG. 6 illustrates a vertical cross-section of a structure of a high-density plasma processing apparatus according to a second embodiment of the present invention.

FIG. 6 illustrates a vertical cross-section of a structure of a high-density plasma processing apparatus according to a second embodiment of the present invention. The high-density plasma processing apparatus of FIG. 6 has substantially the same structure as the high-density plasma processing apparatus of FIG. 4 except that a showerhead 224 is provided as a reaction gas injection device. Hence, a detailed description of the structures of FIG. 6 that are the same as those illustrated and described in connection with the high-density plasma processing apparatus of FIG. 4 will not be repeated.

Referring to FIG. 6, the showerhead 224 is installed through the center of the dielectric window 116 to introduce a reaction gas into the processing chamber 110. A plurality of gas distribution ports 226 is formed in the showerhead 224 to distribute the reaction gas throughout the interior of the processing chamber 110. As described above, the showerhead 224 is installed so that a reaction gas is injected from an upper side of the processing chamber 110 down into the processing chamber 110.

In a further embodiment of the present invention, the reaction gas injection device may be a combination of the circular injector 124 installed on the sidewall of the processing chamber 110 and the showerhead 224 installed through the center of the dielectric window 116. In this arrangement, the reaction gas injection device facilitates control of a reaction gas so that it flows more uniformly toward the wafer W within the processing chamber 110.

As described above, a high-density plasma processing apparatus according to the present invention has the following advantages. First, use of both an ICP antenna and a microwave source that are independently controlled facilitates control of a plasma density and the uniformity of a plasma distribution. Thus, a large wafer, e.g., a wafer with a diameter of no less than 300 mm (12 inches), can be uniformly processed.

Second, due to the use of ECR caused by a microwave together with plasma, the efficiency with which microwave power is absorbed by plasma can be improved, and the plasma density and the uniformity of a plasma distribution can be controlled over a wide range of pressures.

Third, a reaction gas is uniformly distributed within a processing chamber using a circular injector and/or a showerhead, and a susceptor and magnets are operable to move up and down. Thus, the plasma density and the uniformity of the distribution of plasma can be more easily controlled while adaptively coping with a wide range of process parameters.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A high-density plasma processing apparatus, comprising:
   a processing chamber, including a susceptor for supporting an object to be processed positioned therein, and a dielectric window positioned on the processing chamber to form a top wall of the processing chamber;
   a reaction gas injection device for injecting a reaction gas into an interior of the processing chamber;
   an inductively coupled plasma (ICP) antenna, which is installed on a center of the dielectric window and disposed external to the processing chamber, for transferring radio frequency (RF) power from an RF power supply to the interior of the processing chamber;
   a waveguide for guiding a microwave, for generating plasma, generated by a microwave generator; and
   a circular radiative tube, which is installed on the dielectric window around the ICP antenna and is connected to the waveguide, for radiating a microwave toward the interior of the processing chamber via a plurality of slots formed through a bottom wall of the circular radiative tube.

2. The high-density plasma processing apparatus as claimed in claim 1, wherein the RF power is transferred to a central area of the interior of the processing chamber by the ICP antenna and the microwave power is supplied to a peripheral area of the interior of the processing chamber through the plurality of slots in the circular radiative tube, and
   wherein the RF power and the microwave power are independently controlled.

3. The high-density plasma processing apparatus as claimed in claim 1, further comprising a plurality of magnets installed around an outer circumference of the processing chamber for forming a magnetic field within the processing chamber so that a microwave supplied to a peripheral area of the processing chamber in cooperation with plasma can cause electron cyclotron resonance (ECR).

4. The high-density plasma processing apparatus as claimed in claim 3, further comprising:
   an ICP zone, wherein ICP has been distributed with a high density, formed in the central area of the interior of the processing chamber; and
   an ECR zone, wherein ECR occurs, formed in the peripheral area of the interior of the processing chamber.

5. The high-density plasma processing apparatus as claimed in claim 3, wherein each of the plurality of magnets installed around the outer circumference of the processing chamber is arranged at a predetermined interval.

6. The high-density plasma processing apparatus as claimed in claim 3, wherein each of the plurality of magnets is operable to move up and down.

7. The high-density plasma processing apparatus as claimed in claim 3, wherein each of the plurality of magnets is an electromagnet.

8. The high-density plasma processing apparatus as claimed in claim 3, wherein each of the plurality of magnets is a permanent magnet.

9. The high-density plasma processing apparatus as claimed in claim 1, wherein the susceptor is operable to move up and down.

10. The high-density plasma processing apparatus as claimed in claim 1, wherein the susceptor is an electrostatic chuck and secures the object to be processed using an electrostatic force.

11. The high-density plasma processing apparatus as claimed in claim 1, wherein the reaction gas injection device comprises a circular injector having a plurality of gas distribution ports, the circular injector being installed on an inner surface of a sidewall of the processing chamber.

12. The high-density plasma processing apparatus as claimed in claim 1, wherein the reaction gas injection device comprises a showerhead having a plurality of gas distributions ports, the showerhead being installed through the center of the dielectric window.

13. The high-density plasma processing apparatus as claimed in claim 1, wherein the reaction gas injection device comprises:
   a circular injector having a plurality of gas distribution ports, the circular injector being installed on an inner surface of a sidewall of the processing chamber; and
   a showerhead having a plurality of gas distributions ports, the showerhead being installed through the center of the dielectric window.

14. The high-density plasma processing apparatus as claimed in claim 1, further comprising a circulator and a tuner installed on the waveguide.

15. The high-density plasma processing apparatus as claimed in claim 1, wherein the circular radiative tube has a rectangular cross-section.

16. The high-density plasma processing apparatus as claimed in claim 1, wherein the waveguide has a rectangular cross-section.

17. The high-density plasma processing apparatus as claimed in claim 1, wherein the plurality of slots is arranged along a circumference of the circular radiative tube.

* * * * *